United States Patent [19]

Weiner

[11] Patent Number: 5,508,065
[45] Date of Patent: Apr. 16, 1996

[54] METHOD FOR MATERIALS DEPOSITION BY ABLATION TRANSFER PROCESSING

[75] Inventor: Kurt H. Weiner, San Jose, Calif.

[73] Assignee: Regents of the University of California, Oakland, Calif.

[21] Appl. No.: 323,327

[22] Filed: Oct. 14, 1994

[51] Int. Cl.⁶ .................................................. B05D 3/06
[52] U.S. Cl. .................. 427/552; 427/250; 427/255; 427/261; 427/269; 427/287; 427/383.5; 427/404; 427/555; 427/586; 427/596
[58] Field of Search .................................. 427/586, 596, 427/250, 255, 261, 287, 269, 383.5, 404, 555, 552

[56] References Cited

U.S. PATENT DOCUMENTS

| | | | |
|---|---|---|---|
| 5,227,204 | 7/1993 | Vittoria | 427/586 X |
| 5,231,047 | 7/1993 | Ovshinsky et al. | 427/586 X |
| 5,348,776 | 9/1994 | Ippommatsu et al. | 427/586 |

Primary Examiner—Bernard Pianalto
Attorney, Agent, or Firm—Henry P. Sartorio

[57] ABSTRACT

A method in which a thin layer of semiconducting, insulating, or metallic material is transferred by ablation from a source substrate, coated uniformly with a thin layer of said material, to a target substrate, where said material is desired, with a pulsed, high intensity, patternable beam of energy. The use of a patternable beam allows area-selective ablation from the source substrate resulting in additive deposition of the material onto the target substrate which may require a very low percentage of the area to be covered. Since material is placed only where it is required, material waste can be minimized by reusing the source substrate for depositions on multiple target substrates. Due to the use of a pulsed, high intensity energy source the target substrate remains at low temperature during the process, and thus low-temperature, low cost transparent glass or plastic can be used as the target substrate. The method can be carried out atmospheric pressures and at room temperatures, thus eliminating vacuum systems normally required in materials deposition processes. This invention has particular application in the flat panel display industry, as well as minimizing materials waste and associated costs.

23 Claims, 1 Drawing Sheet

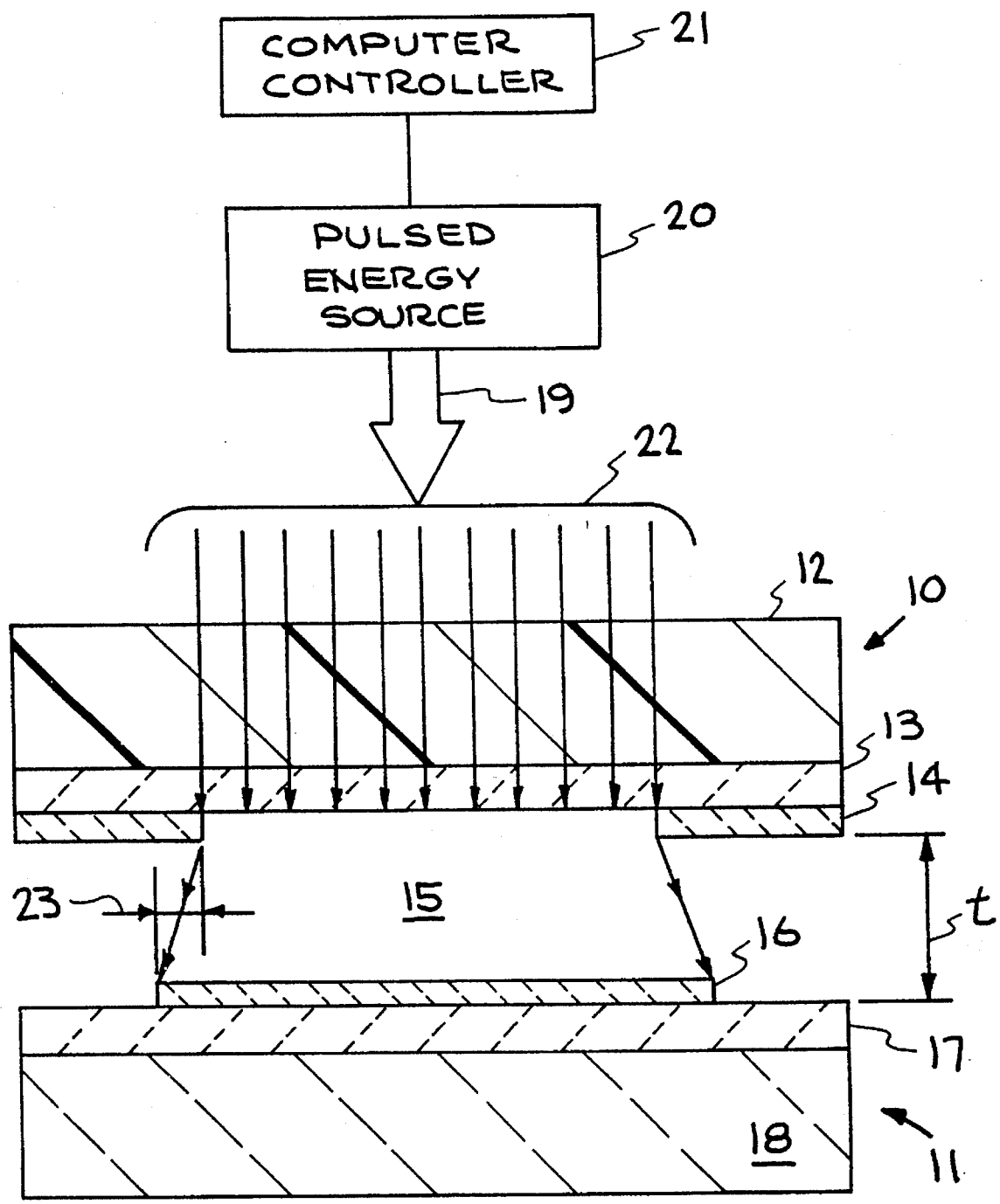

5,508,065

METHOD FOR MATERIALS DEPOSITION BY ABLATION TRANSFER PROCESSING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to materials deposition, particularly to a method for reducing material waste during deposition processing, and more particular to a method for material deposition by ablation transfer processing using a patterned, pulsed, high intensity energy beam to achieve both deposition and patterning.

Numerous manufacturing processes have been developed for the deposition of semiconducting, insulating or metallic materials. Such processes are generally carried out in a vacuum, utilize so-called high temperature, and thus expensive substrates, and involve substantial waste of the processing material.

Manufacturing processes for active-matrix (AM) substrates used in high-quality liquid crystal flat panel displays, for example, are notorious for their high cost and inefficient use of materials. Typical AM substrates, in which millions of transistors are fabricated in thin films of silicon deposited on glass, have an active silicon area of approximately one percent. However, to build the thin-film-transistors (TFT's), silicon and other necessary materials are deposited over 100 percent of the display. Thus, 99 percent of the deposited materials are wasted. As important, removal of the excess material requires expensive techniques, including lithography and etching steps, which can also contribute significantly to substrate contamination. Thus, a need exists for a more efficient method of manufacturing which would use an additive process in which the silicon, metals, and other materials are deposited only in the regions where they are required. By using such a process, material waste is minimized and etching and lithography are eliminated because the layer configuration or pattern has already been defined during the deposition.

Another problem with the current display manufacturing processes is that high substrate temperatures are required to achieve good material quality in the component layers of the TFT. Typically substrate temperatures exceeding 200° C. for a sustained period of time are utilized. This constrains the choice of substrates to so-called high temperature substrate materials which can withstand any type of deformation at these elevated processing temperatures. In most deposition processes, increased substrate temperature is necessary to impart the depositing atoms with sufficient energy to achieve high quality growth. Unfortunately, this limitation precludes the use of inexpensive, so called low-temperature, flexible plastic or inexpensive glass substrates, which are incapable of withstanding sustained (prolonged) processing temperatures greater than 180°–200° C. Recently, the use of pulsed laser processing has enabled the use of these so-called low-temperature, inexpensive substrates, and such is exemplified by copending U.S. application Ser. No. 08/219,487, filed Mar. 29, 1994, entitled "Electronic Devices Utilizing Pulsed-Energy Crystallized Microcrystalline/Polycrystalline Silicon", J. L. Kaschmitter, et al., and assigned to the same assignee.

A final difficulty inherent to display processing is the need to carry out all depositions in vacuum. This limits throughput during the manufacturing sequence and adds to the cost. The need for vacuum processing arises from the use of toxic gases and/or the need to keep the layers contamination free during the deposition. A method is needed in which the layers are deposited from a solid source at atmospheric pressure, without the use of special vacuum processing equipment and thus further reduce the cost of the manufacturing process.

The present invention solves each of the above-mentioned problems by eliminating unnecessary material waste, enabling the use of inexpensive low-temperature substrates, and being carried out at atmospheric pressure and without the use of vacuum systems. This is accomplished by deposition of materials by ablation transfer processing. Similar in methodology to thermal transfer printing the ablation transfer deposition process of this invention can be used to selectively deposit any type material on almost any type of substrate at room temperature and atmospheric pressure.

SUMMARY OF THE INVENTION

An object of the present invention is to provide a method for materials deposition.

A further object of the invention is to provide a method for materials deposition by ablation transfer processing.

A further object of the invention is to provide a materials deposition process in which material waste is significantly reduced.

Another object of the invention is to provide a materials deposition process by which less expensive substrates may be utilized without damage thereto.

Another object of the invention is to provide a materials deposition process using ablation transfer deposition which can be used to selectively deposit any type of material on almost any type of substrate at room temperature and atmospheric pressure.

Another object of the invention is to provide a materials deposition process which makes use of a patterned pulsed energy beam to achieve both deposition and patterning in the one operation, and the use of predeposited material as the ablation source which eliminates the need for layer thickness control during the actual deposition process.

Other objects and advantage of the present invention will become apparent from the following description and accompanying drawing. Basically, the invention involves a method for materials deposition by transfer ablation when a source sheet or substrate containing at least a layer of material to be deposited is positioned at a selected distance from a target sheet or substrate, and a patterned pulsed high intensity energy source, such as a pulsed excimer laser, is directed onto the material on the source sheet and is ablated onto the target sheet or on a layer of material on the target sheet, in a desired pattern and thickness. By this process, material waste is greatly reduced, the target sheet or substrate can be made of less expensive glass or plastic, for example, and the process can be carried out at atmospheric pressure and room temperature, thus eliminating the vacuum systems conventionally utilized in materials deposition processing. Thus, more simply put, the invention involved transferring a material from a solid source on one sheet to another sheet or substrate by means of patterned thermal ablation, thus eliminating plating of the entire substrate and removal of most of the plating. The energy source utilized in the transfer ablation process must have the ability to be patterned into micrometer-size dimensions and then projected, with these dimensions intact, onto the material to be ablated. Due to the very short time duration involved in the ablation transfer process of this invention (thermal cycle of less than 0.1 microseconds), the so-called low-temperature substrates (glass and plastics) may be utilized, as the target substrate, thus further reducing processing costs. Pulsed lasers, for example, can be rastered with computer control to form a pattern which has been stored as a computer file. This invention has wide applications, particularly in the manufacture of flat panel displays, where there is a low percentage of coverage of a deposited material on a substrate, and thus eliminates the excessive material waste of conventional deposition processes.

BRIEF DESCRIPTION OF THE DRAWING

The accompanying drawing, which is incorporated into and forms a part of the disclosure, illustrates the methodology of the invention and, together with the description, serves to explain the principles of the invention.

The single FIGURE schematically illustrates the methodology of the invention wherein a material on a source sheet is transferred to a target sheet by pulsed energy ablation transfer, in accordance with the present invention.

DETAILED DESCRIPTION OF THE INVENTION

The present invention involves a method or process in which a thin layer of semiconducting, insulating, or metallic material is transferred by ablation from a source substrate, coated uniformly with a layer of said material of a desired thickness, to a target substrate, where said material is desired, with a pulsed high-intensity, patternable beam of energy. The pulsed energy for the ablation process may be, but not limited to, pulsed excimer, copper vapor, or YAG lasers. For example, the laser may be a 308 nm XeCl excimer laser producing a selected number of 30 nsec pulses with an energy density of 150 mJ/cm$^{-2}$.

The use of a patternable beam allows area-selective ablation from the source substrate resulting in additive deposition of the material onto a target substrate which may require a very low percentage of the area to be covered. Since material is deposited only where it is required, material waste is minimized by reusing the source substrate depositions on multiple target substrates. For example, in the fabrication of flat panel displays with conventional materials deposition techniques, material is first deposited over the entire substrate and removed from about 99 percent of the substrate, thus creating a significant material waste as well as the increased costs of the excessive deposition and etching or removal of the unneeded materials.

The use of a pulsed, high-intensity energy source, such as a excimer laser, confines the thermal energy necessary to produce high quality material patterned layers to be deposited in a very short time duration, so that target substrate remains at low temperature during the process. Thus, electronic grade material can be deposited at room temperature. An additional advantage of this process is that it provides for very low temperature, additive semiconductor materials processing enabling the use of low-temperature, low-cost transparent glass or plastic substrates of the kind typically desired for the flat panel display industry. The so-called low-temperature substrates are those which are incapable of withstanding, without damage, sustained processing time periods (greater than ~$10^5$ ns) and sustained processing temperatures of greater than about 180°–200° C. For example, the low-temperature substrates may be a less expensive glass, or a plastic, such as polyethersulfone (PES), ethylene-chloratrifluoroethylene (E-CTFE), ethylene-tetra-fluoroethylene (E-TFE), polyethylene teraphthelate (PET), polyvinylidene fluoride (PVDF), poly-tetra-fluoro-ethylene (PTFE), fiberglass enhanced plastic (FEP), and high density poly-ethylene (HOPE).

The process can also be carried out at atmospheric pressures, eliminating the need for bulky and expensive vacuum systems normally required when depositing materials of this nature. The process of this invention has a methodology similar to thermal transfer printing, in that ablation transfer deposition can be used to selectively deposit any type of material, as with an ink in transfer printing, on almost any type of substrate at room temperature and atmospheric pressure.

The principle features of the process of this invention lie in the use of a patterned energy beam to achieve both deposition and patterning in one step, and in the use of a sheet of predeposited material as the ablation source which eliminates the need for layer thickness control during the actual process. This deposition method or process is also well suited to continuous roll processing similar to that used for the printing of newspapers. Thus, it may potentially reduce the cost of fabricating products such as display substrates by a significant amount.

The ablation transfer process of this invention is illustrated schematically in FIG. 1 wherein a source or "ink" sheet generally indicated at 10 is positioned in spaced parallel relation to a target or "product" sheet 10 generally indicated at 11, the distance, spacing, or sheet-to-sheet separation of sheets 10 and 11 being indicated at t. Source sheet 10 includes a substrate base layer, or member 12 an adhesion or intermediate film or layer 13 and a materials layer 14. The materials layer 14 may be of a semiconducting, insulating, or metallic material and is transferred between the two sheets (10 and 11) by means of pattern thermal ablation forming an atomic beam as indicated at 15, with the recondensing ablated material, indicated at 16, being deposited on an intermediate or adhesion layer 17 on a substrate, base layer, or member layer 18 of target or "product" sheet 11.

The materials source, or "ink" sheet 10, is prefabricated and is recyclable, and may include layers in addition to the adhesion layer 13 and materials layer 14 deposited on the backing substrate 12, which may be made of inexpensive (low-temperature) plastic or glass, such as identified above. If the substrate 12 is to be recycled it must also be chemically resistant to etching solutions for the materials layer 14 and adhesion layer 13. The adhesion or intermediate layer 13 may actually be a stack of thin films or layers of different materials, and is utilized when the materials layer 14 and the backing substrate 12 interact in such a manner as to reduce the quality of the transfer process, and thus may be omitted when non-interacting materials are involved. Layers(s) 13 stick well to the backing substrate 12 but allow the material 14 to transfer cleanly onto the target or "product" sheet 11. The thin layers or films 13 and 14, typically ≦100 nm, may be deposited on the backing substrate 12 using convention physical vapor deposition carried out in a vacuum environment, for example, or by other deposition techniques which would not damage the backing substrate if composed of low-temperature plastic or glass. The adhesion or intermediate layer 17 of target or "product" sheet 11 may, as in the layer 13 of source or "ink" sheet 10, be composed of layers of different material to insure that there is no interaction between the backing substrate 18 and the deposited material 16 being ablated from materials layer 14 of sheet 10, and may have a thickness of ≦100 nm, with backing substrate being composed, for example, of low-temperature, inexpensive, plastic or glass, such as exemplified above. The ablating material, indicated at 15, is deposited as layer 16 with a thickness equal to the thickness, d, of materials layer 14. The ablated material of layer 16 may be deposited directly onto backing substrate 18 of the target or "product" sheet 11 where an adhesion or intermediate layer 17 is not required, as discussed above.

Ablation transfer of material from the materials layer 14 of the source or "ink" sheet 10 to form the patterned layer 16 on the target or "product" sheet 11 is carried out by directing a pulsed, patterned energy beam 19 from a pulsed energy source 20, controlled by a computer controller 21 onto the materials layer 14 as illustrated in the drawing. Typical energy sources for the ablation process may be, but not limited to, pulsed lasers of the excimer and YAG type, exemplified by the above-referenced XeCl excimer laser. An important constraint on the energy source is the ability to be patterned into micrometer-size dimensions and then projected, with these dimensions intact, onto the materials or "ink" layer 14 either from the back, through the substrate 12 and adhesion layer 13 of the source or "ink" sheet 10, in which case the substrate 12 and adhesion layer 13 must be transparent to the energy beam 19, as illustrated in the drawing; or from the front, through the backing substrate 18 and adhesion layer 17 of the target or "product" sheet 11, in which case the substrate 18 and adhesion layer 17 must be transparent to the energy beam 19. In both cases the "ink" or materials layer 14 must be highly absorbing or be deposited on a very thin (<50 nm), but highly absorbing sacrificial layer, not shown. By patterning the beam 19 from the energy source 20, via the computer controller 21, prior to interaction with the material 14, the ablation process is limited to very small, predefinable areas, thus achieving materials deposition and patterning at the same time.

The pattern transfer efficiency is governed by the expansion of the ablation plume, indicated at 22, which in turn, is dictated by the sheet spacing, t, and the kinetic energy of the ablated atoms and the ambient pressure. The ablation process is explosive and, as a result, the atoms contain a high amount of kinetic energy and are expelled with a high degree of directionality. The directionality of the atomic beam 15 makes pattern transfer efficient (i.e. small plume expansion, ΔX, indicated at 23) while the kinetic energy level of the deposited species makes the layer 16 quality comparable to processes that occur at much higher substrate temperatures. Thus, it is possible to deposit device quality materials on room temperature substrates, thus enabling the use of the above references low-temperature plastics and glass. The process can be achieved in localized environments of nitrogen or helium at atmospheric pressures. The explosivity of the ablation (material 14) layer can also be adjusted by varying the hydrogen content in the materials layer(s) 14 during the formation of the source or "ink" sheet 10.

By way of example, the source or "ink" sheet 10 may be composed of a backing substrate 12 made from PET having a thickness of 3 to 10 mils and width of 10 cm to 2 m, an intermediate or adhesion layer 13 composed of $SiO_2$ having a thickness of 10 to 100 nm; and a materials layer 14 composed of Si having a thickness of 50 to 200 nm; with the target or "ink" sheet 11 being composed of a backing substrate 18 made of PET having a width of 10 cm to 2 m and thickness of 3 to 10 mils, and an intermediate layer 17 made of $Si_3N_4$ having a thickness of 50 to 100 nm, with the thickness of the ablation deposited layer 16 having a width of 1 to 500 nm and a thickness of up to the thickness of the materials layer 14. The source and target sheet may be spaced apart a distance, t, of 0 to 5 mils. The pulsed, patterned energy beam may have an energy density in the range of 0.1 to 1 $J/cm^2$ with 1 to 100 pulses of a time during of 1 ms to 10 s, with the ablation plume 22 having a width of 1 to 500 μm, with a plume expansion 23 being 0 to 20% of plume 22 on each side of the plume 22. In addition to the pulsed energy source 20 being a pulsed YAG copper vapor, or XeCl excimer laser, it may also constitute other types of excimer lasers, dye lasers or pulsed x-ray sources. Depending on the material to be ablated, such as Si, $Si_3N_4$, $SiO_2$ or Ti, and the composition of the backing substrates, such as silicon, plastic, or glass, the intermediate or adhesion layers 13 and 17, if used, may also be composed of one or more thin layers of $SiO_2$, $Si_3N_4$, SiC, or C. It is to be understood that the composition of the substrates 12 and 18 and the adhesion layer 13 and 17, if used, may determine the direction which the energy passes (front or back) to ablate the materials layer 14. Also, it is to be noted that the width of the ablation plume 22 is predetermined by the input into the computer controller 21 and thus may be wide or narrow depending on the desired or required pattern.

It is thus seen that by utilization of the ablation transfer process of this invention, it is not necessary, for example, to plate a substrate, mask the plating, and remove the unmasked plated material, thus elimination of the waste of material and the time and associated costs of masking and removing the unwanted material, thereby reducing the costs of manufacture. This invention lies primarily in the use of a pulsed patterned energy beam to achieve both deposition and patterning in one step, in the use of a sheet of predeposited material as the ablation source which eliminates the need for layer thickness control during the actual deposition process, reduces the processing time temperature durations such that inexpensive, low-temperature substrates may be used without damage thereto during processing, and enables the deposition process to be carried out under atmospheric pressure conditions, thus eliminating the need for vacuum systems.

While specific materials, energies, times, temperatures, distances, and energy sources, etc. have been described and/or illustrated to set forth the operation and principles of the invention, such are not intended to be limiting. Modifications and changes may become apparent to those skilled in the art and it is intended that the invention be limited only by to scope of the appended claims.

I claim:

1. A method for depositing material by ablation transfer on a surface comprising:

providing a first substrate with a quantity of material to be deposited;

providing a second substrate with a surface on which the material is to be deposited;

positioning the surface in a substantially parallel relation to the material to be deposited; and directing patterned pulsed energy through one of the substrates onto the material to be deposited causing ablation thereof and transfer to the surface on which it is to be deposited.

2. The method of claim 1, wherein providing the quantity of material to be deposited is carried out by depositing the material onto a backing surface of the first substrate.

3. The method of claim 2, additionally including providing an adhesion material between the backing surface of the first substrate and the material to be deposited.

4. The method of claim 3, additionally including providing an adhesion material on the surface of the second substrate prior to directing pulsed energy onto the material to be deposited.

5. The method of claim 1, additionally including passing the pulsed energy through the surface of the second substrate and onto the material to be deposited.

6. The method of claim 1, additionally including depositing the material to be deposited on a substrate composed of material selected from the group consisting of silicon, glass and plastic.

7. The method of claim 6, additionally including selecting the substrate from material incapable of withstanding sustained processing temperatures greater than about 0°–200° C.

8. The process of claim 7, additionally including providing a layer of adhesive material intermediate the substrate and the material to be deposited.

9. The process of claim 8, additionally including providing a layer of adhesive material on a surface of the substrate prior to depositing the material thereon.

10. The method of claim 1, additionally including forming the surface on which the material is to be deposited to include a substrate incapable of withstanding sustained processing temperatures greater than about 180°–200° C.

11. The method of claim 1, wherein the patterned pulsed energy is produced by a pulsed energy source selected from the group of excimer lasers, YAG laser, copper vapor lasers, dye lasers, and pulsed x-ray sources.

12. The method of claim 1, wherein the patterned pulsed energy is patterned and controlled by a means connected to the pulsed energy source for patterning and controlling the pulsed energy produced thereby.

13. The method of claim 1, wherein the method for depositing material on the surface of the second substrate is carried out at room temperature and atmospheric pressure.

14. The method of claim 1, wherein both deposition and patterning are carried out simultaneously.

15. The method of claim 1, additionally including forming at least one of the substrates from a low temperature material incapable of withstanding sustained processing temperatures greater than about 200° C. for a time period of not greater than about $10^5$ nanoseconds.

16. The method of claim 1, additionally including providing means for patterning the pulsed energy, and wherein the material deposited on the surface of the second substrate is in a pattern substantially the same as the pattern of the material ablated from the first substrate.

17. A method for materials deposition by ablation transfer processing, comprising:

providing a material to be deposited by depositing at least a layer of the material onto a surface of a substrate;

providing at least a substrate on which the materials to be deposited;

positioning a surface of at least the substrate on which the material is to be deposited at a selected distance from the material to be deposited; and directing pulsed energy through a substrate and onto at least portions of the material to be deposited causing ablation and transfer thereof to the surface located at a selected distance therefrom.

18. The method of claim 17, additionally including forming an adhesion layer intermediate the substrate and the material to be deposited.

19. The method of claim 17, additionally including providing the surface of the substrate on which the material is to be deposited with an adhesive layer prior to directing pulsed energy onto the material to be deposited.

20. The method of claim 13, additionally including forming at least one of the substrates from material transparent to the pulsed energy.

21. The method of claim 13, additionally including patterning the pulsed energy directed onto the material to be deposited such that material ablated and transferred is of a substantially same pattern as a pattern directed onto the material to be deposited by the patterned pulsed energy.

22. The method of claim 17 additionally producing the pulsed energy from a pulsed energy source selected from the group consisting of YAG lasers, excimer lasers, copper vapor lasers, dye lasers, and pulsed x-ray sources.

23. The method of claim 17, additionally including forming at least one of the substrates from material incapable of withstanding sustained processing temperatures of greater than about 200° C.

\* \* \* \* \*